(12) United States Patent
Tsuno et al.

(10) Patent No.: US 12,107,096 B2
(45) Date of Patent: Oct. 1, 2024

(54) IMAGING DEVICE

(71) Applicant: Panasonic Intellectual Property Management Co., Ltd., Osaka (JP)

(72) Inventors: Morikazu Tsuno, Shiga (JP); Takanori Doi, Toyama (JP); Yoshinori Takami, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 260 days.

(21) Appl. No.: 17/232,408

(22) Filed: Apr. 16, 2021

(65) Prior Publication Data

US 2021/0351212 A1 Nov. 11, 2021

(30) Foreign Application Priority Data

May 11, 2020 (JP) ................................ 2020-083446

(51) Int. Cl.
*H01L 27/146* (2006.01)

(52) U.S. Cl.
CPC ............................. *H01L 27/14609* (2013.01)

(58) Field of Classification Search
CPC ..... H01L 31/022408–022416; H01L 31/1864; H01L 21/28587–28593; H01L 23/49838–49844; H01L 29/41–42396; H01L 21/823406; H01L 27/1057; H01L 29/765–76891; H01L 29/66946–66962; H01L 27/146–14893; H10K 30/81–83

See application file for complete search history.

(56) References Cited

U.S. PATENT DOCUMENTS

| | | | | |
|---|---|---|---|---|
| 6,376,376 | B1* | 4/2002 | Lim | H01L 21/7684 438/692 |
| 7,781,327 | B1* | 8/2010 | Kailasam | H01L 21/76844 438/622 |
| 2008/0224243 | A1* | 9/2008 | Lee | H01L 27/14636 257/E31.127 |
| 2009/0127599 | A1* | 5/2009 | Kim | H01L 27/14665 257/E31.127 |
| 2011/0049492 | A1 | 3/2011 | Sawaki et al. | |
| 2014/0043510 | A1 | 2/2014 | Kasuga et al. | |
| 2016/0013247 | A1* | 1/2016 | Nakatani | H10K 30/81 257/40 |
| 2018/0350862 | A1 | 12/2018 | Nakajun et al. | |

(Continued)

FOREIGN PATENT DOCUMENTS

| | | |
|---|---|---|
| JP | 2011-071469 A | 4/2011 |
| JP | 2018-207102 A | 12/2018 |
| WO | 2012/147302 | 11/2012 |

*Primary Examiner* — Eric A. Ward
*Assistant Examiner* — Nora T. Nix
(74) *Attorney, Agent, or Firm* — Rimon P.C.

(57) ABSTRACT

An imaging device includes a photoelectric conversion layer, a counter electrode provided above the photoelectric conversion layer, a pixel electrode that faces the counter electrode with the photoelectric conversion layer disposed between the counter electrode and the pixel electrode, and a contact plug covered with the pixel electrode and connected to the pixel electrode. The pixel electrode includes a first layer and a second layer provided on the first layer in contact with the first layer. A surface of the first layer that is in contact with the second layer has a protrusion that protrudes upward.

17 Claims, 10 Drawing Sheets

(56) References Cited

U.S. PATENT DOCUMENTS

2019/0131340 A1* 5/2019 Kim .................. H04N 25/00
2020/0119098 A1* 4/2020 Sakaida ............ H01L 27/14636
2022/0052099 A1* 2/2022 Ito .................... H01L 27/14623

* cited by examiner ically held. The fluctuation

IMAGING DEVICE

BACKGROUND

1. Technical Field

The present disclosure relates to an imaging device.

2. Description of the Related Art

A Charge Coupled Device (CCD) image sensor and a Complementary Metal Oxide Semiconductor (CMOS) image sensor are widely used in digital cameras and other devices. These image sensors have a photodiode provided on a semiconductor substrate.

A structure in which a photoelectric conversion layer is provided above a semiconductor substrate instead of a photodiode is proposed as disclosed in International Publication No. 2012/147302. An imaging device having such a structure is sometimes called a stacked imaging device. In a stacked imaging device, an electric charge generated by photoelectric conversion is temporarily accumulated as a signal electric charge, for example, in a diffusion region formed on a semiconductor substrate. A signal according to an amount of accumulated electric charge is read out through a CCD circuit or a CMOS circuit provided on the semiconductor substrate.

SUMMARY

One non-limiting and exemplary embodiment provides the following.

In one general aspect, the techniques disclosed here feature an imaging device according to an aspect of the present disclosure including a photoelectric conversion layer, a counter electrode provided above the photoelectric conversion layer, a pixel electrode that faces the counter electrode with the photoelectric conversion layer disposed between the counter electrode and the pixel electrode, and a contact plug covered with the pixel electrode and connected to the pixel electrode. The pixel electrode includes a first layer and a second layer provided on the first layer in contact with the first layer. A surface of the first layer that is in contact with the second layer has a protrusion that protrudes upward.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Outline of Present Disclosure

Figure 1:
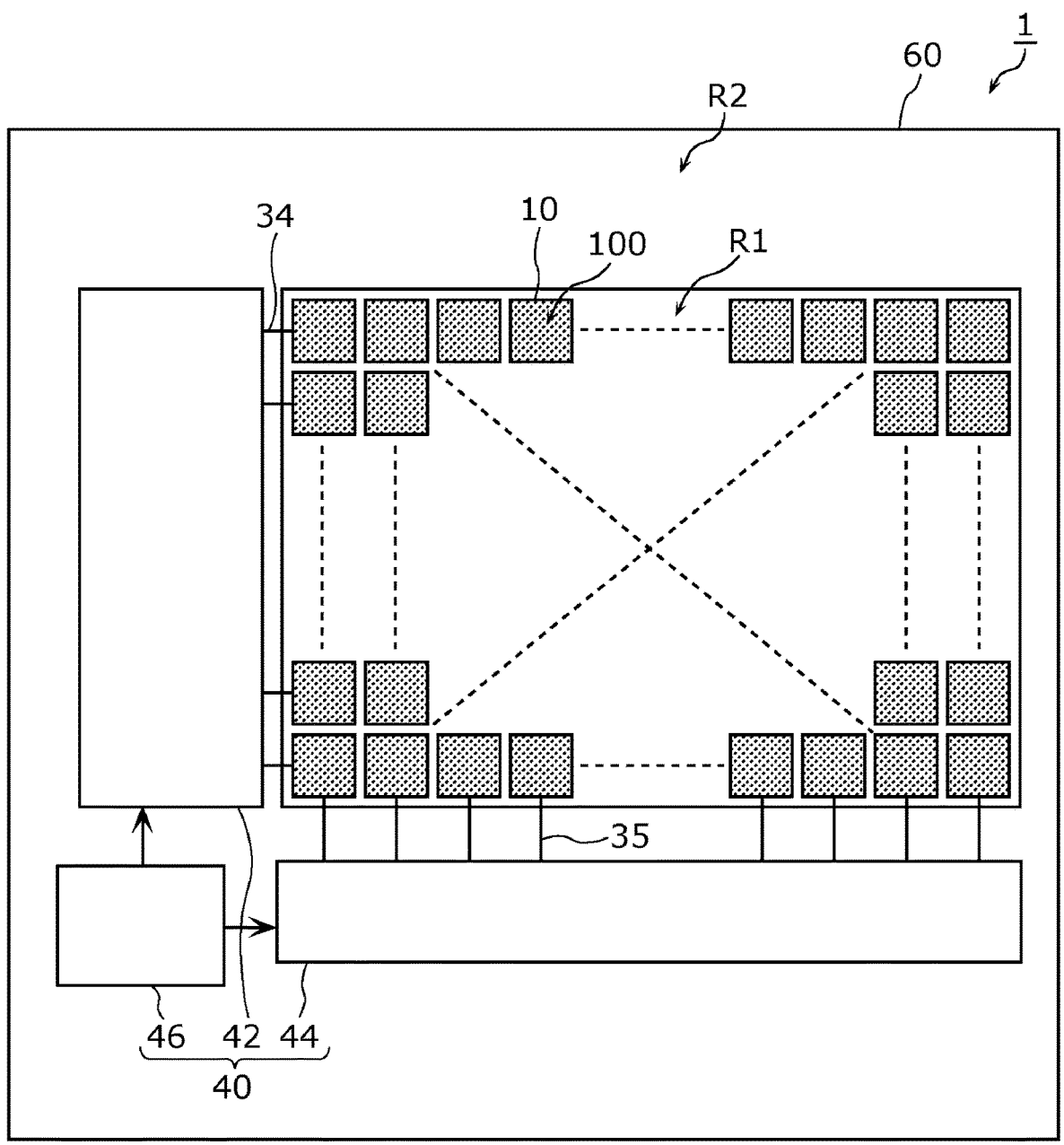
FIG. 1 illustrates an exemplary configuration of an imaging device according to an embodiment.

An outline of an aspect of the present disclosure is as follows.

An electric charge amount can fluctuate due to parasitic resistance generated in a pixel electrode before an electric charge generated in a photoelectric conversion layer is taken out through the pixel electrode to a diffusion region where a signal electric charge is temporarily held. The fluctuation in electric charge amount can cause noise. The noise can decrease image quality of an obtained image. It is therefore beneficial if such unintended parasitic resistance of the pixel electrode can be suppressed.

The inventors found that in a case where a surface of a contact plug connected to a pixel electrode provided below a photoelectric conversion layer has a recess, tensile stress in the pixel electrode increases during thermal treatment, and as a result, a crystal defect can occur in the pixel electrode. The crystal defect in the pixel electrode increases parasitic resistance. This can be a cause of noise.

Meanwhile, an imaging device according to an aspect of the present disclosure includes a photoelectric conversion layer, a counter electrode provided above the photoelectric conversion layer, a pixel electrode that faces the counter electrode with the photoelectric conversion layer disposed between the counter electrode and the pixel electrode, and a contact plug covered with the pixel electrode and connected to the pixel electrode. The pixel electrode includes a first layer and a second layer provided on the first layer so as to be in contact with the first layer. A surface of the first layer that is in contact with the second layer has a protrusion protruding upward.

In a case where the contact surface between the first layer and the second layer of the pixel electrode, that is, an upper surface of the first layer has a protrusion as described above, tensile stress generated in a thickness direction in the pixel electrode during thermal treatment is mitigated. This suppresses occurrence of a crystal defect in the pixel electrode, thereby suppressing parasitic resistance of the pixel electrode.

The protrusion may have, for example, a convex curve.

Since the upper surface of the first layer is smoothly curved as described above, concentration of stress is suppressed. This can suppress occurrence of local stress in the pixel electrode, thereby suppressing occurrence of a crystal defect in the pixel electrode.

Furthermore, for example, a lower surface of the first layer may have a recessed part recessed upward.

For example, this makes it possible to provide the protrusion on the upper surface of the first layer while keeping the thickness of the first layer uniform. This can increase film quality of the first layer, thereby suppressing occurrence of a crystal defect in the first layer.

For example, an upper surface of the contact plug may be in contact with the recessed part.

This makes it possible to easily form the protrusion on the upper surface of the first layer that covers the contact plug. This does not need complicated processing of the protrusion, thereby suppressing occurrence of a crystal defect in the pixel electrode.

Furthermore, for example, the imaging device according to the aspect of the present disclosure may further include an insulating layer that covers a side surface of the contact plug, and the upper surface of the contact plug may protrude upward beyond the insulating layer.

With the configuration, the protrusion can be easily formed on the upper surface of the first layer by using the protrusion of the contact plug. This does not need complicated processing of the protrusion, thereby suppressing occurrence of a crystal defect in the pixel electrode.

For example, the first layer may be a Ti layer, and the second layer may be a TiN layer.

With the configuration, diffusion of a metal material contained in the contact plug can be suppressed by the Ti layer. Furthermore, since TiN has a suitable work function with the photoelectric conversion layer, efficiency of taking out an electric charge can be increased.

Furthermore, for example, the contact plug may include a Cu and a barrier layer that surrounds a side surface of the Cu layer, and the barrier layer may contain Ta.

With the configuration, diffusion of Cu to the insulating layer can be suppressed by the barrier layer. This can suppress a leakage current while keeping sufficient electric conductivity of the contact plug.

An embodiment of the present disclosure is described in detail below with reference to the drawings.

The embodiment described below illustrates a general or specific example. Numerical values, shapes, materials, constituent elements, a way in which the constituent elements are disposed and connected, manufacturing steps, an order of the manufacturing steps, and the like in the embodiment below are merely examples and do not limit the present disclosure. Various aspects described herein can be combined unless inconsistency occurs. Among the constituent elements in the embodiment below, constituent elements that are not described in independent claims are described as optional constituent elements.

In the following description, constituent elements having substantially identical functions are given identical reference signs, and description thereof may be omitted. Furthermore, illustration of an element may be omitted in order to keep the drawings from becoming too complicated.

Furthermore, various elements illustrated in the drawings are merely schematically illustrated for understanding of the present disclosure, and dimensional ratios, outer appearance, and the like thereof may be different from actual ones. That is, each drawing is a schematic view and is not necessarily strict. Therefore, for example, scales of the drawings do not necessarily match.

Furthermore, terms such as "parallel" and "match" describing a relationship between elements, terms such as "rectangular" describing a shape of an element, and numerical ranges are not necessarily strict and encompasses substantially equivalent ranges, for examples, differences of approximately several percent.

Furthermore, the terms "upper", "upward", "above", "lower", "downward", and "below" as used herein do not mean an upper side (upper side in a vertical direction) and a lower side (lower side in a vertical direction) in absolute space recognition but are used as terms defined by a relative positional relationship based on an order in which elements are stacked. Specifically, a light receiving side of an imaging device is referred to as an "upper side", and a side opposite to the light receiving side if referred to as a "lower side". Similarly, a surface of each member that faces the light receiving side of the imaging device is referred to as an "upper surface", and a surface of each member that faces the side opposite to the light receiving side is referred to as a "lower surface". Note that terms such as "upper", "upward", "above", "lower", "downward", "below", "upper surface", and "lower surface" are used to specify a positional relationship between members and do not limit a posture in which the imaging device is used. Furthermore, the terms "upper", "upward", "above", "lower", "downward", and "below" are used not only in a case where two constituent elements are disposed apart from each other with another constituent element interposed therebetween, but also in a case where two constituent elements are disposed in contact with each other. Furthermore, "plan view" as used herein refers to viewing from a direction perpendicular to a semiconductor substrate.

EMBODIMENT

Circuit Configuration of Imaging Device

First, a circuit configuration of an imaging device according to an embodiment is described below with reference to FIG. 1.

FIG. 1 illustrates an exemplary configuration of an imaging device 1 according to the present embodiment. The imaging device 1 illustrated in FIG. 1 includes a plurality of pixels 10 and a peripheral circuit 40 provided on a semiconductor substrate 60.

Each pixel 10 includes a photoelectric conversion unit 100. The photoelectric conversion unit 100 generates positive and negative electric charges, typically a hole-electron pair upon receipt of incident light. The photoelectric conversion unit 100 includes a photoelectric conversion layer disposed above the semiconductor substrate 60. The photoelectric conversion unit 100 may further include a photodiode provided on the semiconductor substrate 60. Although the photoelectric conversion units 100 of the respective pixels 10 are spatially separate from one another in FIG. 1, this is merely for convenience of description. The photoelectric conversion units 100 of the respective pixels 10 may be continuous with one another on the semiconductor substrate 60 with no gap therebetween.

In the example illustrated in FIG. 1, the plurality of pixels 10 are arranged in m rows and n columns (m and n are integers of two or more). The plurality of pixels 10 are, for example, two-dimensionally arranged on the semiconductor substrate 60 to form an imaging region R1. In a case where each pixel 10 includes, for example, the photoelectric conversion unit 100 disposed above the semiconductor substrate 60, the imaging region R1 can be defined as a region of the semiconductor substrate 60 covered with the photoelectric conversion units 100.

The number of pixels 10 and a way in which the pixels 10 are disposed are not limited to those in the example illustrated in FIG. 1. For example, the imaging device 1 may include only one pixel 10. Furthermore, for example, although a center of each pixel 10 is located at a grid point of a square grid, a center of each pixel 10 may be located at a grid point of a grid such as a triangular grid or a hexagonal grid. Furthermore, for example, the plurality of pixels 10 may be one-dimensionally arranged. In this case, the imaging device 1 can be used as a line sensor.

In the configuration illustrated in FIG. 1, the peripheral circuit 40 includes a vertical scanning circuit 42 and a horizontal signal readout circuit 44. As illustrated in FIG. 1, the peripheral circuit 40 may further include a control circuit 46. Furthermore, for example, the peripheral circuit 40 may further include a voltage supplying circuit that supplies a predetermined voltage, for example, to the pixels 10. The peripheral circuit 40 may further include a signal processing circuit, an output circuit, and other circuits.

The peripheral circuit 40 is provided, for example, in a peripheral region R2 located around the imaging region R1. Although the peripheral region R2 is an annular region that surrounds the imaging region R1 in the example illustrated in FIG. 1, the peripheral region R2 is not limited to this. The peripheral region R2 may be an L-shaped region along two sides of the imaging region R1 or may be an elongated region along one side of the imaging region R1.

The vertical scanning circuit 42 is also called a row scanning circuit. The vertical scanning circuit 42 is connected to address signal lines 34 provided corresponding to respective rows of the plurality of pixels 10. As described later, signal lines provided corresponding to respective rows of the plurality of pixels 10 are not limited to the address signal lines 34. The vertical scanning circuit 42 may be connected to plural kinds of signal lines provided corresponding to respective rows of the plurality of pixels 10.

The horizontal signal readout circuit 44 is also called a column scanning circuit. The horizontal signal readout circuit 44 is connected to vertical signal lines 35 provided corresponding to respective columns of the plurality of pixels 10.

The control circuit 46 controls the whole imaging device 1 upon receipt of command data, a clock, or the like given, for example, from an outside of the imaging device 1. Typically, the control circuit 46 has a timing generator and supplies a driving signal, for example, to the vertical scanning circuit 42 and the horizontal signal readout circuit 44. In FIG. 1, the arrows extending from the control circuit 46 schematically express flows of an output signal from the control circuit 46. The control circuit 46 may be, for example, a microcontroller including one or more processors. Functions of the control circuit 46 may be realized by a combination of a general-purpose processing circuit and software. Alternatively, the functions of the control circuit 46 may be realized by hardware specialized for target processing.

Figure 2:
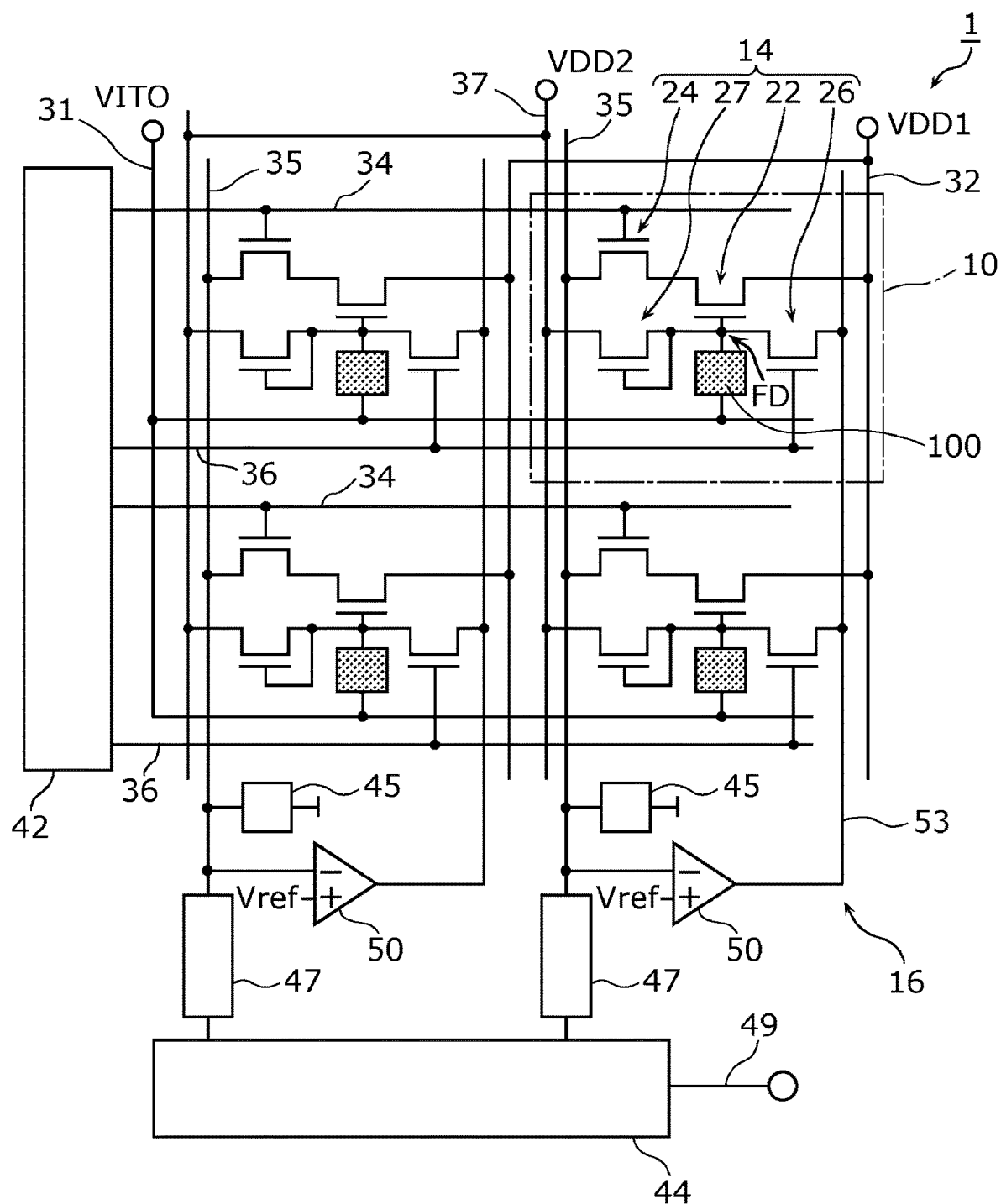
FIG. 2 is a circuit diagram schematically illustrating an exemplary circuit configuration of the imaging device according to the embodiment.

FIG. 2 is a circuit diagram schematically illustrating an exemplary circuit configuration of the imaging device 1 according to the present embodiment. In FIG. 2, representative four pixels 10 arranged in two rows and two columns are illustrated for simplification of illustration. Each of these pixels 10 is an example of the pixels 10 illustrated in FIG. 1. Each of the plurality of pixels 10 includes the photoelectric conversion unit 100 and a signal detection circuit 14 electrically connected to the photoelectric conversion unit 100. The photoelectric conversion unit 100 includes a photoelectric conversion layer 120 (see FIG. 3) disposed above the semiconductor substrate 60. That is, a stacked imaging device is illustrated as the imaging device 1.

The photoelectric conversion unit 100 of each pixel 10 is connected to an accumulation control line 31. During operation of the imaging device 1, a predetermined voltage VITO is applied to the accumulation control line 31. For example, in a case where a positive electric charge among positive and negative electric charges generated by photoelectric conversion is used as a signal electric charge, for example, a positive voltage of approximately 10 V can be applied to the accumulation control line 31 during operation of the imaging device 1. The following illustrates a case where a hole is used as a signal electric charge.

In the configuration illustrated in FIG. 2, the signal detection circuit 14 includes a signal detection transistor 22, an address transistor 24, a reset transistor 26, and a protection transistor 27. The signal detection transistor 22, the address transistor 24, the reset transistor 26, and the protection transistor 27 are typically Field Effect Transistors (FETs) provided on the semiconductor substrate 60 that supports the photoelectric conversion unit 100. The following discusses an example in which an N channel MOSFET is used as a transistor unless otherwise specified.

As schematically illustrated in FIG. 2, a gate of the signal detection transistor 22 is electrically connected to the photoelectric conversion unit 100. In the example illustrated in FIG. 2, an electric charge accumulation node FD that connects the gate of the signal detection transistor 22 to the photoelectric conversion unit 100 has a function of temporarily holding an electric charge generated by the photoelectric conversion unit 100. By applying a predetermined voltage to the accumulation control line 31 during operation, for example, a hole can be accumulated as a signal electric charge in the electric charge accumulation node FD. The electric charge accumulation node FD includes an impurity region formed in the semiconductor substrate 60.

A drain of the signal detection transistor 22 is connected to a power source wire 32. The power source wire 32 supplies a power source voltage VDD1 to each pixel 10 during operation of the imaging device 1. The power source voltage VDD1 is, for example, 3.3 V. A source of the signal detection transistor 22 is connected to the vertical signal line 35 with the address transistor 24 interposed therebetween. The signal detection transistor 22 receives the power source voltage VDD1 through the drain thereof and thereby outputs a signal voltage corresponding to an amount of signal electric charge accumulated in the electric charge accumulation node FD.

A gate of the address transistor 24 connected between the signal detection transistor 22 and the vertical signal line 35 is connected to the address signal line 34. The vertical scanning circuit 42 applies a row selection signal that controls on and off of the address transistor 24 to the address signal line 34. This allows output of the signal detection transistor 22 of a selected pixel 10 to be read out to a corresponding vertical signal line 35. Note that the position of the address transistor 24 is not limited to that in the example illustrated in FIG. 2 and may be between the drain of the signal detection transistor 22 and the power source wire 32.

A gate and a drain of the protection transistor 27 are connected to the electric charge accumulation node FD. A source of the protection transistor 27 is connected to a power source wire 37. The power source wire 37 supplies a power source voltage VDD2 to each pixel 10 during operation of the imaging device 1. The power source voltage VDD2 is lower than the power source voltage VDD1 and is, for example, 2.0 V. In a case where light of high luminance is incident on the photoelectric conversion unit 100, an amount of hole accumulated in the electric charge accumulation node FD increases. In this case, there is a possibility that, for example, a bias exceeding 5 V is generated in the electric charge accumulation node FD and breaks a gate oxide film of the signal detection transistor 22 connected to the electric charge accumulation node FD. In view of this, for example, in a case where a high bias exceeding 5 V is generated in the electric charge accumulation node FD, the protection transistor 27 is made conductive. By thus discharging a hole accumulated in the electric charge accumulation node FD, a potential of the electric charge accumulation node FD can be decreased.

Each of the plurality of vertical signal lines 35 is connected to a load circuit 45 and a column signal processing circuit 47. The load circuit 45 forms a source follower circuit together with the signal detection transistor 22. The column signal processing circuit 47 is also called a row signal accumulation circuit. The column signal processing circuit 47 performs processing such as noise suppression signal processing represented by correlated double-sampling and analog-digital conversion. The horizontal signal readout circuit 44 sequentially reads out a signal from the plurality of column signal processing circuits 47 to a horizontal common signal line 49. The load circuit 45 and the column signal processing circuit 47 can be parts of the peripheral circuit 40.

A gate of the reset transistor 26 is connected to a reset signal line 36 connected to the vertical scanning circuit 42. The reset signal line 36 is provided for each row of the plurality of pixels 10 as with the address signal line 34. The vertical scanning circuit 42 can select a row of pixels 10 to be reset by applying a row selection signal to the address signal line 34. Furthermore, the vertical scanning circuit 42 can switch on and off of the reset transistor 26 of the selected row by applying a reset signal to the gate of the reset transistor 26 through the reset signal line 36. When the reset transistor 26 is turned on, the potential of the electric charge accumulation node FD is reset.

In this example, one of a drain and a source of the reset transistor 26 is connected to the electric charge accumulation node FD, and the other one of the drain and the source of the reset transistor 26 is connected to a corresponding one of feedback lines 53 provided for the respective columns of the plurality of pixels 10. That is, in this example, a voltage of the feedback line 53 is supplied to the electric charge accumulation node FD as a reset voltage for initializing the electric charge of the photoelectric conversion unit 100.

In the configuration illustrated in FIG. 2, the imaging device 1 includes a feedback circuit 16 including an inverting amplifier 50 as a part of a feedback path. As illustrated in FIG. 2, the inverting amplifier 50 is provided for each column of the plurality of pixels 10, and the feedback line 53 is connected to a corresponding one of output terminals of the plurality of inverting amplifiers 50. The inverting amplifier 50 can be a part of the peripheral circuit 40.

As illustrated in FIG. 2, an inverting input terminal of the inverting amplifier 50 is connected to the vertical signal line 35 of a corresponding column. A reference voltage Vref is supplied to a non-inverting input terminal of the inverting amplifier 50 during operation of the imaging device 1. By turning the address transistor 24 and the reset transistor 26 on, a feedback path for negative feedback of output of a corresponding pixel 10 can be formed. As a result of formation of the feedback path, the voltage of the vertical signal line 35 converges to the reference voltage Vref, which is an input voltage to the non-inverting input terminal of the inverting amplifier 50. In other words, as a result of formation of the feedback path, the voltage of the electric charge accumulation node FD is reset to a voltage such that the voltage of the vertical signal line 35 becomes the reference voltage Vref. The reference voltage Vref can be a voltage of any magnitude within a range of the power source voltage and ground. The reference voltage Vref is, for example, 1 V or a positive voltage close to 1 V. As a result of the formation of the feedback path, reset noise generated by turning the reset transistor 26 off can be reduced. Details of suppression of reset noise using feedback are described in International Publication No. 2012/147302, the entire contents of which are herein incorporated by reference.

Structure of Photoelectric Conversion Unit 100

Figure 3:
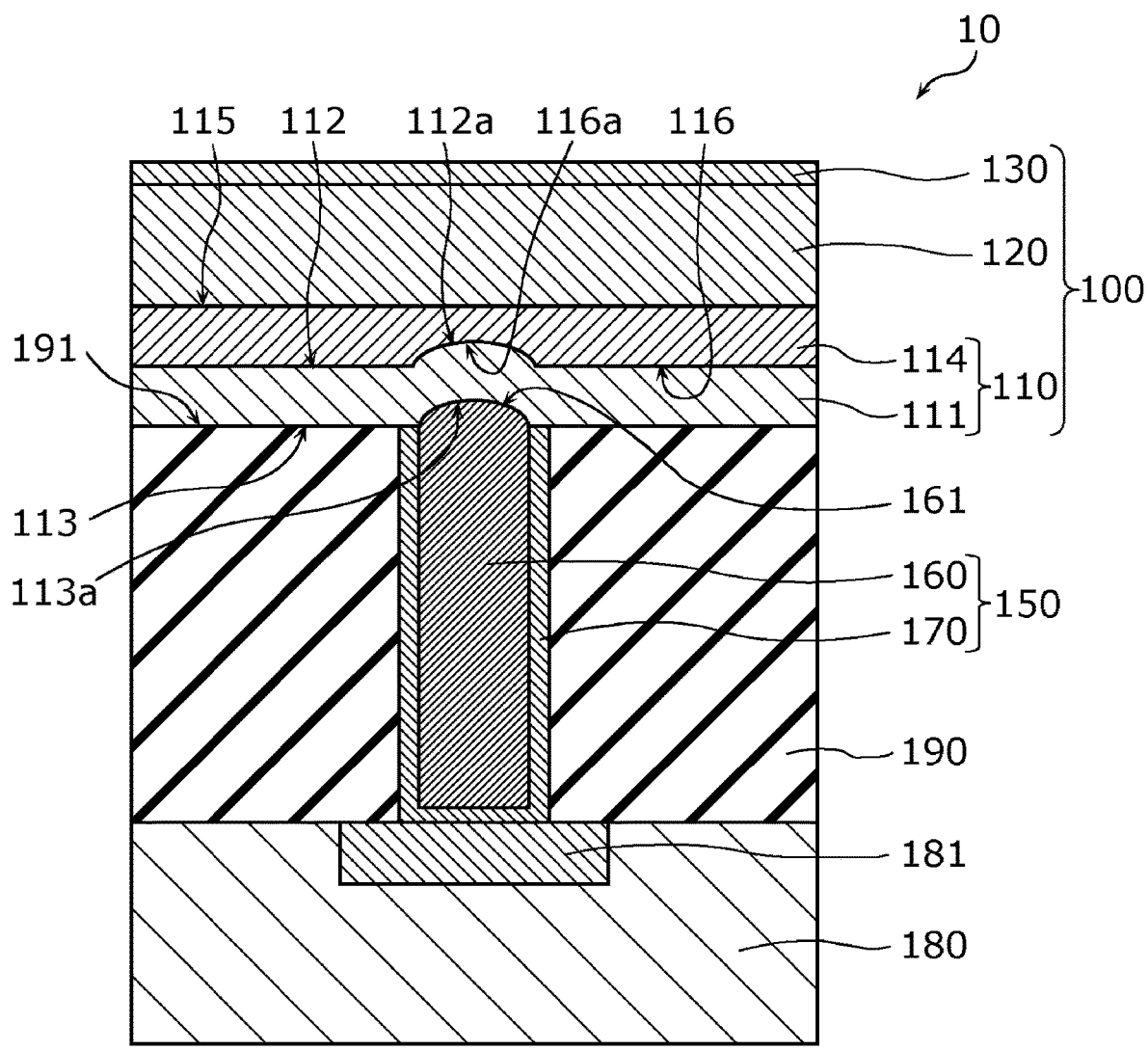
FIG. 3 is a cross-sectional view schematically illustrating an example of a structure of a photoelectric conversion unit of the imaging device according to the embodiment.

Next, a structure of the photoelectric conversion unit 100 is described in detail below with reference to FIG. 3. FIG. 3 is a cross-sectional view schematically illustrating an example of a structure of the photoelectric conversion unit 100 of the imaging device 1 according to the present embodiment. FIG. 3 schematically illustrates a cross-sectional structure of a single pixel.

As illustrated in FIG. 3, each pixel 10 includes the photoelectric conversion unit 100, a pixel device unit 180, a contact plug 150, and an interlayer insulating layer 190. Although illustration of a detailed configuration is omitted in FIG. 3, the pixel device unit 180 includes the semiconductor substrate 60, and the signal detection transistor 22, the address transistor 24, the reset transistor 26, and the protection transistor 27 provided on a surface of the semiconductor substrate 60. The transistors included in the pixel device unit 180 are connected by a plurality of wiring layers (not illustrated).

The plurality of wiring layers constitute, for example, the address signal line 34, the reset signal line 36, the vertical signal line 35, the power source wire 32, the power source wire 37, and the feedback line 53 illustrated in FIG. 2. The plurality of wiring layers are made of an electrically conductive material. Examples of the electrically conductive material include metals such as copper and tungsten and metal compounds such as metal nitrides and metal oxides.

The interlayer insulating layer 190 is provided above a wiring layer 181, which is an uppermost one of the wiring layers that constitute the pixel device unit 180. The interlayer insulating layer 190 is, for example, an insulating layer made of an inorganic material such as tetraethyl orthosilicate (TEOS), a silicon dioxide film, a silicon nitride film, or a silicon oxynitride film.

The contact plug 150 penetrates the interlayer insulating layer 190. The contact plug 150 connects the photoelectric conversion unit 100 and the wiring layer 181. The wiring layer 181 is electrically connected to an impurity region (not illustrated), which is formed as a part of the electric charge accumulation node FD on a surface of the semiconductor substrate 60. The impurity region, for example, functions as one of the source and the drain of the reset transistor 26. The photoelectric conversion unit 100 is thus electrically connected to the signal detection circuit 14 illustrated in FIG. 2 through the contact plug 150 and the wiring layer 181.

As illustrated in FIG. 3, the photoelectric conversion unit 100 includes a pixel electrode 110, a photoelectric conversion layer 120, and a counter electrode 130.

The pixel electrode 110 is provided on the interlayer insulating layer 190. Specifically, the pixel electrode 110 covers an upper surface 191 of the interlayer insulating layer 190 and an upper surface 161 of the contact plug 150 in contact with these upper surfaces. As illustrated in FIG. 3, the pixel electrode 110 includes a first layer 111 and a second layer 114. That is, the pixel electrode 110 has a multilayer structure made up of two layers having electric conductivity. First, advantages of the multilayer structure of the pixel electrode 110 are described below.

The second layer 114 is a TiN layer. The TiN layer is a layer containing titanium nitride (TiN) as a main component. For example, the TiN layer is a layer whose titanium nitride content is almost 100%. The TiN layer may contain an impurity inevitably contained in a manufacturing process.

A work function difference between a material of which the photoelectric conversion layer 120 is made and an electrode material that makes contact with the photoelectric conversion layer 120 is optimized in order for the pixel electrode 110 to efficiently take out a signal electric charge generated by the photoelectric conversion layer 120. As a result of studies, the inventors found that TiN is most suitable as an electrode material as for photoelectric conversion according to the present embodiment. Therefore, in a case where the second layer 114 that is in contact with the photoelectric conversion layer 120 is a TiN layer, efficiency of taking out a signal electric charge can be increased.

Alternatively, the second layer 114 may contain another electrically conductive material selected in accordance with a work function difference with a material of which the photoelectric conversion layer 120 is made instead of TiN.

Meanwhile, TiN is poor in prevention of heat diffusion of a metal such as Cu. Therefore, in a case where the contact plug 150 contains a metal material, the metal material may diffuse to other layers, thereby leading to a decline in reliability of the imaging device 1.

Meanwhile, the first layer 111 whose lower surface 113 is in contact with the contact plug 150 is a Ti layer. The Ti layer is a layer that contains titanium (Ti) as a main component. For example, the Ti layer is a layer made of titanium alone. The Ti layer may contain an impurity inevitably contained in a manufacturing process. The Ti layer has higher metal heat diffusion prevention performance than the TiN layer. Accordingly, the first layer 111 can suppress heat diffusion of a metal material such as Cu.

Alternatively, the first layer 111 may contain another electrically conductive material having high metal material heat diffusion prevention performance instead of Ti.

As described above, since the pixel electrode 110 has a multilayer structure including two layers made of different materials, efficiency of taking out an electric charge and reliability of the imaging device 1 can be improved. Shapes of the layers are described in detail below.

The first layer 111 is a lower layer of the pixel electrode 110. The first layer 111 is directly connected to the contact plug 150. The first layer 111 has an upper surface 112 and a lower surface 113. The lower surface 113 is a surface on a semiconductor substrate 60 side, and the upper surface 112 is a surface on a side opposite to the lower surface 113. The lower surface 113 covers the upper surface 191 of the interlayer insulating layer 190 and the upper surface 161 of the contact plug 150 in contact with the upper surface 191 and the upper surface 161. The upper surface 112 is a surface of the first layer 111 that is in contact with the second layer 114. Specifically, the upper surface 112 is in contact with a lower surface 116 of the second layer 114.

The upper surface 112 has a protrusion 112a that protrudes upward. The protrusion 112a is a convex curve. The protrusion 112a is a gently-curved convex curve. That is, a height of the protrusion 112a is shorter than a width of the protrusion 112a on a cross section passing vertexes of the protrusion 112a. Specifically, the height of the protrusion 112a is equal to or smaller than a half of the width of the protrusion 112a. Alternatively, the height of the protrusion 112a may be equal to or smaller than ¼ of the width of the protrusion 112a. The protrusion 112a is provided so as to overlap the contact plug 150 in plan view.

The lower surface 113 has a recessed part 113a recessed upward. The recessed part 113a is a concave curve. The recessed part 113a is provided so as to overlap the contact plug 150 in plan view. The upper surface 161 of the contact plug 150 is in contact with the recessed part 113a.

The protrusion 112a and the recessed part 113a have substantially identical size and shape. A depth and an area in plan view of the recessed part 113a are substantially identical to a height and an area in plan view of the protrusion 112a.

The first layer 111 has a uniform thickness. As illustrated in FIG. 3, the upper surface 161 of the contact plug 150 protrudes upward beyond the upper surface 191 of the interlayer insulating layer 190. This makes it possible to easily form the recessed part 113a and the protrusion 112a by forming the first layer 111 having a uniform thickness over the upper surface 191.

The second layer 114 is an upper layer of the pixel electrode 110. The second layer 114 covers the upper surface 112 of the first layer 111 in contact with the upper surface 112. The second layer 114 has an upper surface 115 and a lower surface 116. The lower surface 116 is a surface on a semiconductor substrate 60 side, and the upper surface 115 is a surface on a side opposite to the lower surface 116. The lower surface 116 covers the upper surface 112 of the first layer 111 in contact with the upper surface 112. The upper surface 115 is in contact with the photoelectric conversion layer 120.

The upper surface 115 is a flat surface. Note that the upper surface 115 may have a protrusion similar to the protrusion 112a.

The lower surface 116 has a recessed part 116a recessed upward. The recessed part 116a is a concave curve. A shape of the recessed part 116a is identical to a shape of the protrusion 112a of the upper surface 112 of the first layer 111. By forming the second layer 114 so that the second layer 114 covers the upper surface 112 having the protrusion 112a, the recessed part 116a is easily formed on the lower surface 116.

A thickness of the second layer 114 is larger than a thickness of the first layer 111. Alternatively, the thickness of the second layer 114 may be equal to the thickness of the first layer 111 or may be smaller than the thickness of the first layer 111.

The second layer 114 and the first layer 111 are made of different materials and have different compositions. Furthermore, the second layer 114 and the first layer 111 have different coefficients of thermal expansion. Specifically, a coefficient of thermal expansion of the second layer 114 is smaller than a coefficient of thermal expansion of the first layer 111. In a case where the second layer 114 is a TiN layer, the coefficient of thermal expansion of the second layer 114 is greater than or equal to approximately $6.3 \times 10^{-6}$/K and less than or equal to approximately $7.8 \times 10^{-6}$/K. In a case where the first layer 111 is a Ti layer, the coefficient of thermal expansion of the first layer 111 is greater than or equal to approximately $8.4 \times 10^{-6}$/K and less than or equal to approximately $8.6 \times 10^{-6}$/K.

Note that the pixel electrode 110 is provided for each pixel 10. The pixel electrode 110 is spatially separate from the pixel electrode 110 of an adjacent pixel 10. As a result, the pixel electrode 110 is electrically separated from the pixel electrode 110 of the adjacent pixel 10.

The photoelectric conversion layer 120 is disposed between the pixel electrode 110 and the counter electrode 130. The photoelectric conversion layer 120 is in contact with the upper surface 115 of the pixel electrode 110 and a lower surface of the counter electrode 130.

The photoelectric conversion layer 120 is made of an organic material or an inorganic material. Examples of the inorganic material include amorphous silicon. Examples of the organic material include an organic p-type semiconductor and an organic n-type semiconductor made of a known material. The photoelectric conversion layer 120 may include a layer made of an organic material and a layer made of an inorganic material. The photoelectric conversion layer 120 may be, for example, a film made of a mixture of organic donor molecules and acceptor molecules, a film made of a mixture of semiconductor carbon nanotubes and acceptor molecules, or a quantum dot containing film.

The photoelectric conversion layer 120 generates positive and negative electric charges through photoelectric conversion upon receipt of light incident through the counter electrode 130. The photoelectric conversion layer 120 is typically provided continuously over the plurality of pixels 10. The photoelectric conversion layer 120 is a single flat plate that covers a large part of the imaging region R1 of the semiconductor substrate 60 in plan view. That is, the photoelectric conversion layer 120 is shared by the plurality of pixels 10. In other words, the photoelectric conversion units 100 provided for the respective pixels 10 include respective different portions of the photoelectric conversion layer 120. Photoelectric conversion layers 120 may be separately provided for the respective pixels 10.

The photoelectric conversion layer 120 may include a carrier transport layer that transports an electron or a hole and a blocking layer that blocks a carrier in addition to a photoelectric conversion film that performs photoelectric conversion.

The counter electrode 130 is provided above the photoelectric conversion layer 120. In the present embodiment, the counter electrode 130 covers an upper surface of the photoelectric conversion layer 120 in contact with the upper surface of the photoelectric conversion layer 120.

The counter electrode 130 is a light-transmitting electrode made of a transparent electrically conductive material. The transparent electrically conductive material can be, for example, Indium Tin Oxide (ITO). The transparent electrically conductive material may be a transparent electrically conductive semiconductor of other kinds such as aluminum-doped zinc oxide (AZO) or gallium-doped zinc oxide (GZO). The counter electrode 130 may be a metal thin film that is thin enough to allow transmission of light.

The term "light-transmitting" as used herein means allowing transmission of at least part of light of a wavelength that can be absorbed by the photoelectric conversion layer 120, and the counter electrode 130 need not allow transmission of light throughout an entire wavelength range of visible light. In a case where a wavelength that can be absorbed by the photoelectric conversion layer 120 is infrared light, the counter electrode 130 having light transmission need just allow transmission of infrared light and need not allow transmission of visible light.

Typically, the counter electrode 130 is formed continuously over the plurality of pixels 10 as with the photoelectric conversion layer 120. That is, the counter electrode 130 is shared by the plurality of pixels 10. In other words, the photoelectric conversion units 100 provided for the respective pixels 10 include respective different portions of the counter electrode 130. Counter electrodes 130 may be separately provided for the respective pixels 10.

The counter electrode 130 is connected to the accumulation control line 31 illustrated in FIG. 2 (not illustrated in FIG. 3). During operation of the imaging device 1, a potential of the counter electrode 130 is made higher than a potential of the pixel electrode 110 by controlling the potential of the accumulation control line 31. This allows the pixel electrode 110 to selectively collect positive ones of positive and negative electric charges generated by the photoelectric conversion layer 120 as a signal electric charge. By forming the counter electrode 130 as a single layer continuous over the plurality of pixels 10, a predetermined potential can be applied collectively to the counter electrode 130 of the plurality of pixels 10.

Structure of Contact Plug 150

Next, a structure of the contact plug 150 is described with reference to FIG. 3.

As illustrated in FIG. 3, the contact plug 150 is covered with the pixel electrode 110 and is connected to the pixel electrode 110. The contact plug 150 penetrates the interlayer insulating layer 190 and is connected to the wiring layer 181. The contact plug 150 includes a metal layer 160 and a barrier layer 170.

The metal layer 160 is a Cu layer. The Cu layer is a layer that contains copper (Cu) as a main component. For example, the Cu layer is a layer made of copper alone. The Cu layer may contain an impurity inevitably contained in a manufacturing process. The metal layer 160 may contain a metal material other than Cu.

The barrier layer 170 surrounds side surfaces of the metal layer 160. In the present embodiment, the barrier layer 170 covers not only the side surfaces of the metal layer 160, but also a bottom surface of the metal layer 160. That is, the barrier layer 170 is provided between the metal layer 160 and the interlayer insulating layer 190 and between the metal layer 160 and the wiring layer 181. For example, the barrier layer 170 covers an almost entire surface of the metal layer 160 other than the upper surface 161 so that the metal layer 160 does not directly make contact with the interlayer insulating layer 190 and the wiring layer 181.

A thickness of the barrier layer 170 is smaller than a width of the metal layer 160. The width of the metal layer 160 is a length in a direction parallel with a main surface of the semiconductor substrate 60. Note that the thickness of the barrier layer 170 may be equal to or larger than the width of the metal layer 160.

The barrier layer 170 contains Ta. The barrier layer 170 may be a multilayer structure made up of a Ta layer and a TaN layer. The barrier layer 170 may contain Ti or TiN. A material contained in the barrier layer 170 and a material contained in the second layer 114 of the pixel electrode 110 may be identical or may be different.

As illustrated in FIG. 3, the upper surface 161 of the contact plug 150 is in contact with the recessed part 113a of the lower surface 113 of the first layer 111 of the pixel electrode 110. The upper surface 161 protrudes upward beyond the upper surface 191 of the interlayer insulating layer 190. The upper surface 161 that protrudes upward beyond the interlayer insulating layer 190 is an upper surface of the metal layer 160. An upper end of the barrier layer 170 is flush with the upper surface 191 of the interlayer insulating layer 190. A shape of the upper surface 161 is identical to a shape of the recessed part 113a. Specifically, the upper surface 161 is a convex curve.

Effects Produced by Configuration in which Boundary Between Two Layers Included in Pixel Electrode 110 is Bulged As described above, the pixel electrode 110 has a multi-layer structure including the first layer 111 and the second layer 114. A boundary between the first layer 111 and the second layer 114 is bulged upward. According to this configuration, it is possible to suppress parasitic resistance of the pixel electrode 110. A reason for this is described below with reference to FIGS. 4 through 7.

Figure 4:
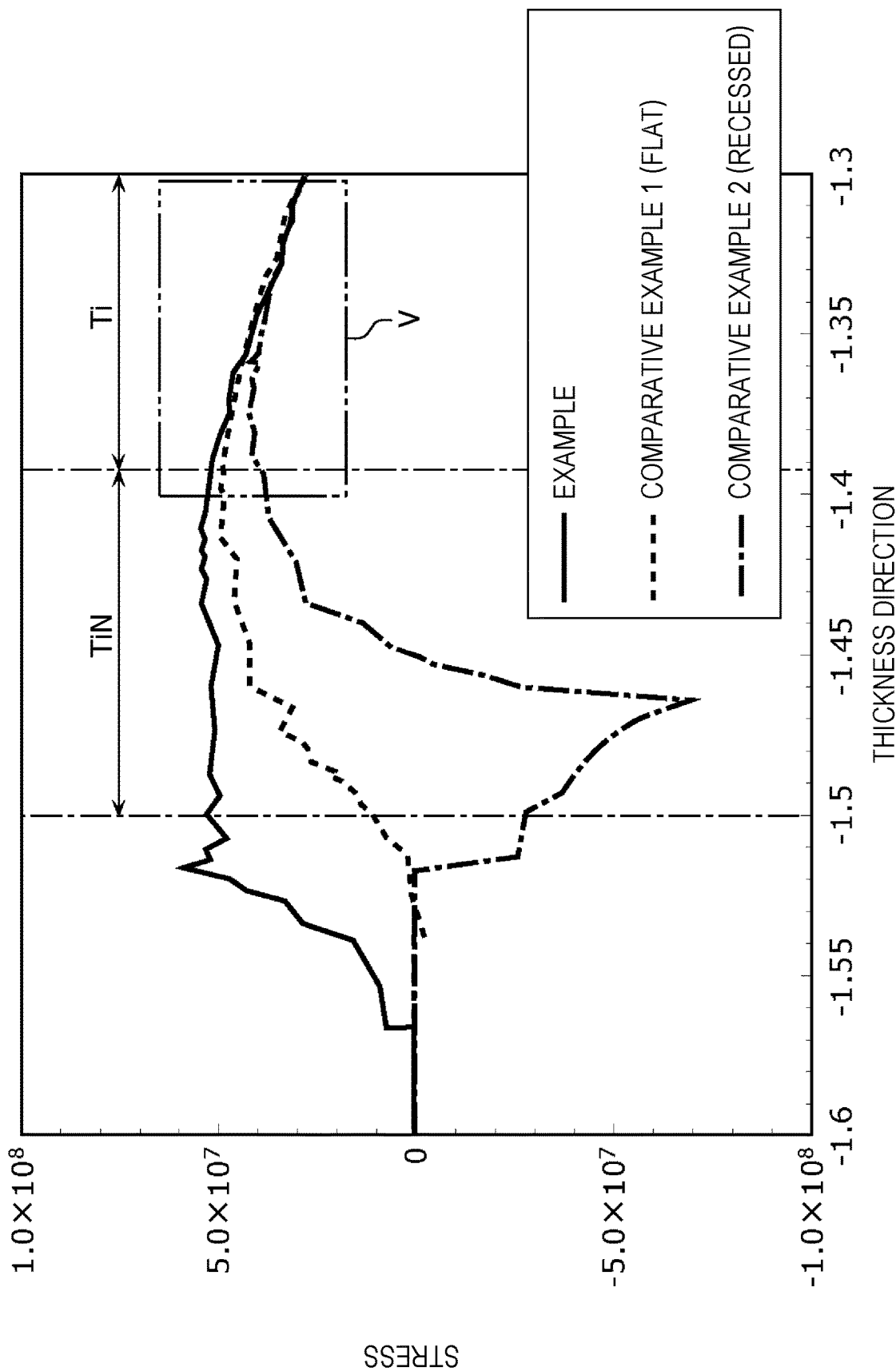
FIG. 4 is a graph illustrating distributions of stress in a thickness direction close to pixel electrodes according to Example and Comparative Examples.
Figure 5:
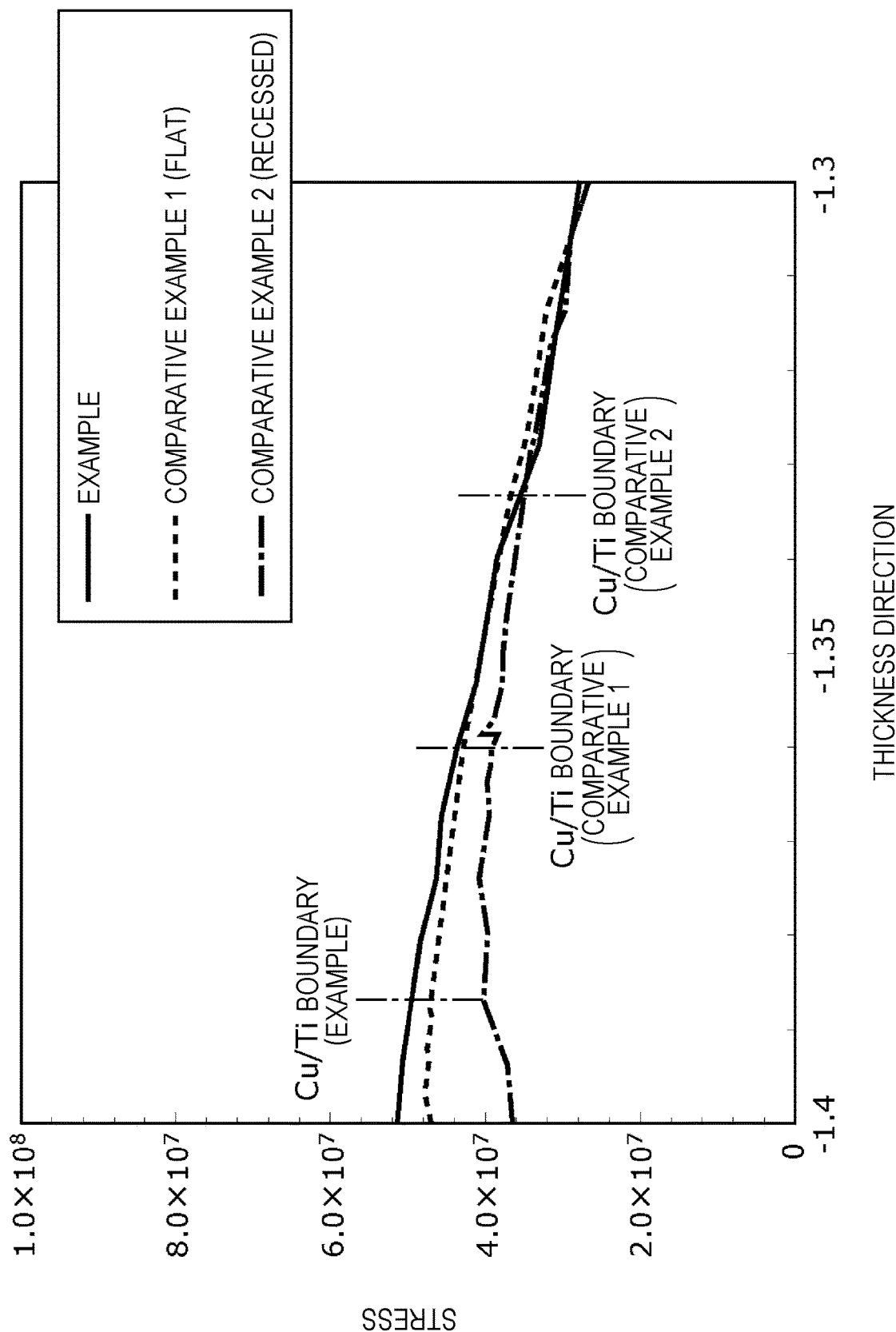
FIG. 5 is an enlarged view of a region V in FIG. 4.

FIG. 4 is a graph illustrating distributions of stress in a thickness direction close to pixel electrodes according to Example and Comparative Examples. FIG. 5 is an enlarged view of a region V in FIG. 4. FIGS. 4 and 5 illustrate results of simulation of stress generated in three kinds of pixel electrodes according to Example and Comparative Examples 1 and 2.

Each of the three kinds of pixel electrodes according to Example and Comparative Examples 1 and 2 has a multi-layer structure made up of a Ti layer and a TiN layer. The Ti layer corresponds to the first layer 111, and the TiN layer corresponds to the second layer 114. A Cu layer corresponding to the metal layer 160 of the contact plug 150 is connected to a lower surface of the Ti layer. A TEOS layer used as a mask for patterning of the pixel electrode is provided on the TiN layer. In the simulation, the thicknesses of the Ti layer, the TiN layer, and the TEOS layer are 30 nm, 80 nm, and 70 nm, respectively.

Example and Comparative Examples 1 and 2 are different in shape of a boundary between the Ti layer and the TiN layer. Specifically, in Example, the boundary is a convex curve that protrudes upward as with the pixel electrode 110 illustrated in FIG. 3. In Comparative Example 1, the boundary is a flat surface orthogonal to the thickness direction. In Comparative Example 2, the boundary is a concave curve recessed downward.

In Example, in which the boundary between the Ti layer and the TiN layer is bulged upward, a boundary between the TiN layer and the TEOS layer is also bulged upward. That is, the study was conducted in a state where the TiN layer has a uniform thickness immediately before flattening processing of the upper surface of the TiN layer unlike the finally obtained pixel electrode 110 illustrated in FIG. 3. Similarly, in Comparative Example 2, in which the boundary between the Ti layer and the TiN layer is recessed downward, the boundary between the TiN layer and the TEOS layer is also recessed downward.

Values on the horizontal axis in FIGS. 4 and 5 represent positions in the thickness direction of the layers in the simulation. A larger value indicates a deeper position in the thickness direction, that is, a position closer to the semiconductor substrate. In the pixel electrode according to Comparative Example 1, in which the layers are flat, a position of −1.5 indicates a position of the boundary between the TiN layer and the TEOS layer, and a position of approximately −1.39 indicates a position of the boundary between the TiN layer and the Ti layer. As illustrated in FIG. 5, the position of the boundary between the Ti layer and the Cu layer becomes deeper in the thickness direction in an order of Example, Comparative Example 1, and Comparative Example 2.

The vertical axes in FIGS. 4 and 5 represent stress applied to the layers that constitute the pixel electrode. In a case where the stress is larger than 0, stress stretching in the thickness direction, that is, tensile stress is applied to the layers. In a case where the stress is smaller than 0, stress contracting in the thickness direction, that is, compressive stress is applied to the layers.

Figure 6:
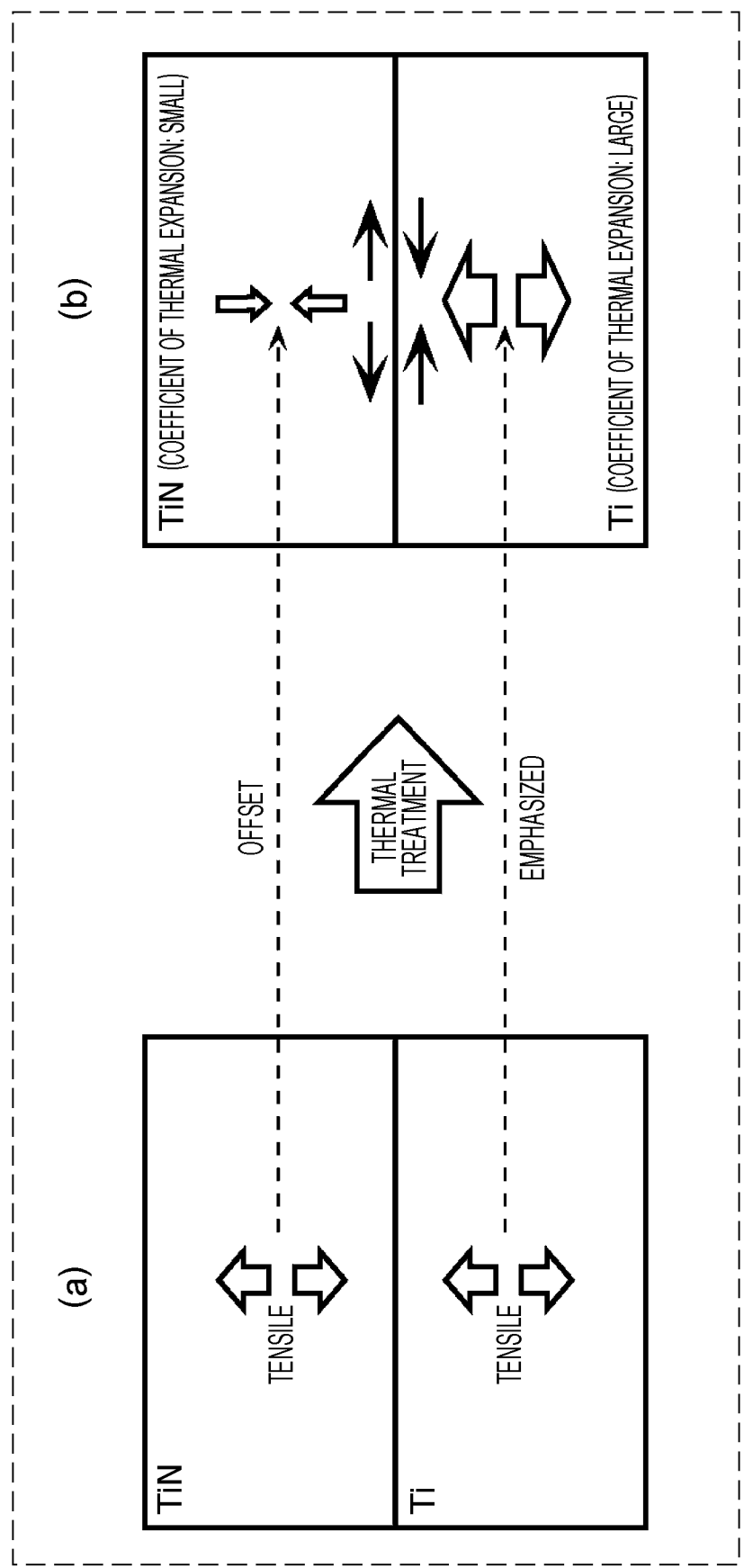
FIG. 6 is a schematic cross-sectional view for explaining stress generated in two layers included in the pixel electrode according to Example.
Figure 7:
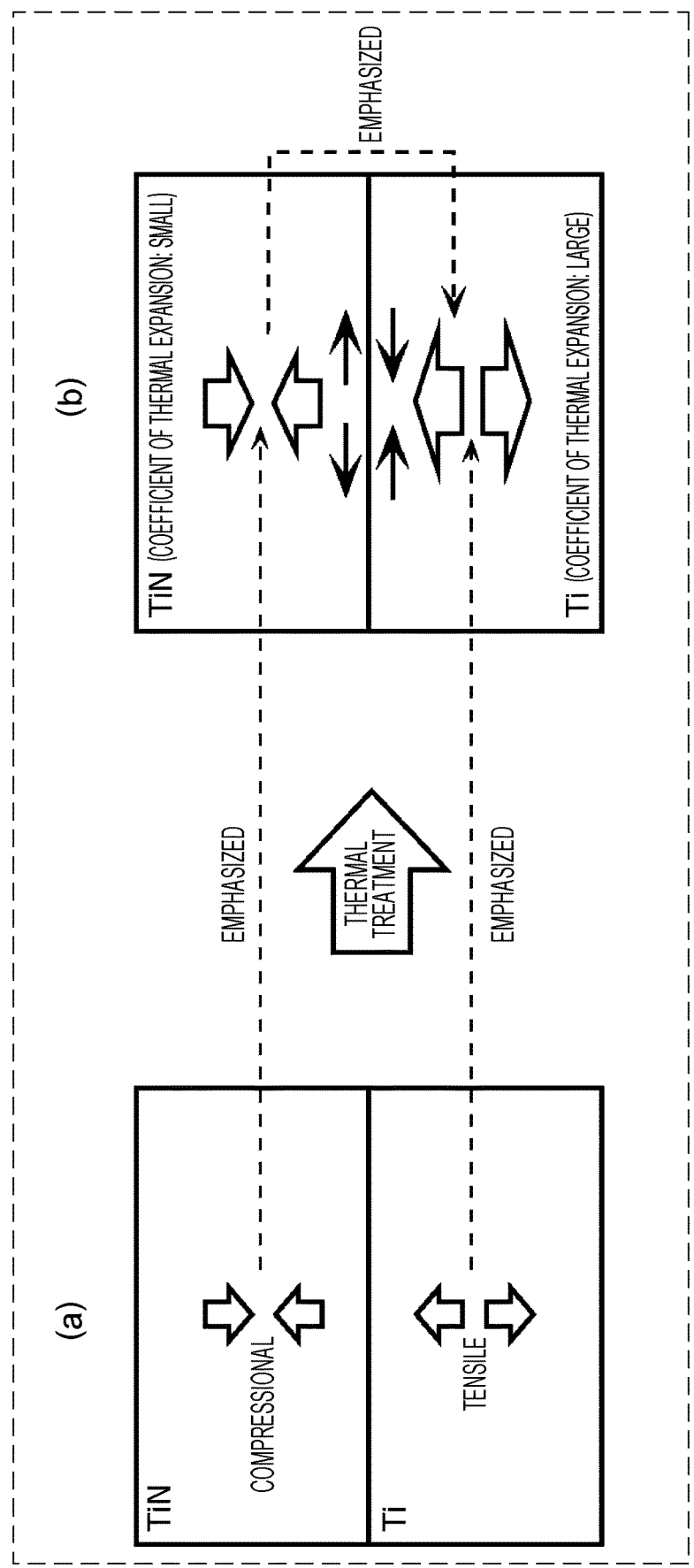
FIG. 7 is a schematic cross-sectional view for explaining stress generated in two layers included in the pixel electrode according to Comparative Example.

FIGS. 6 and 7 are schematic cross-sectional views for explaining stress generated in the two layers included in the pixel electrodes according to Example and Comparative Examples. The portions (a) of FIGS. 6 and 7 illustrate a state before the pixel electrodes are thermally-treated, and the portions (b) of FIGS. 6 and 7 illustrate a state after the pixel electrodes are thermally-treated. The thermal treatment is performed, for example, in a general protection film deposition process performed after formation of the pixel electrode 110 or a thermal treatment process such as hydrogen sintering of a wire.

As indicated by the graph of Example in FIG. 4, both of stress applied to the TiN layer and stress applied to the Ti layer is larger than 0 in Example. Accordingly, as illustrated in the portion (a) of FIG. 6, the tensile stress is present as residual stress in both of the TiN layer and the Ti layer. The stress applied to the TiN layer is larger than the stress applied to the Ti layer throughout an almost entire region in the thickness direction.

In a case where thermal treatment is applied, the Ti layer more easily expands than the TiN layer because the coefficient of thermal expansion of the Ti layer is larger than the coefficient of thermal expansion of the TiN layer. Lattice matching needs to be achieved on the boundary between the Ti layer and the TiN layer. Accordingly, compressive stress acting in a contracting direction is generated in a direction along the boundary in the Ti layer, which is easier to expand, so that lattice matching with the TiN layer, which is harder to expand, is achieved. The compressive stress along the boundary is converted into tensile stress in the Ti layer in the thickness direction. Accordingly, the tensile stress before the thermal treatment is emphasized in the Ti layer as illustrated in the portion (b) of FIG. 6.

Meanwhile, tensile stress acting in a stretching direction is generated in a direction along the boundary in the TiN layer, which is harder to expand, so that lattice matching with the Ti layer, which is easier to expand, is achieved. This tensile stress along the boundary is converted into compressive stress in the TiN layer in the thickness direction. Accordingly, the tensile stress before the thermal treatment is weakened by being offset by the compressional stress in the TiN layer as illustrated in the portion (b) of FIG. 6.

Accordingly, in the pixel electrode according to Example, occurrence of a dislocation defect is suppressed since the tensile stress in the TiN layer is weakened. This can reduce parasitic resistance of the pixel electrode.

Meanwhile, in Comparative Example 2, stress is smaller than 0 in the TiN layer, and stress is larger than 0 in the Ti layer as indicated by the graph of Comparative Example 2 in FIG. 4. Accordingly, as illustrated in the portion (a) of FIG. 7, compressive stress is present as residual stress in the TiN layer, and tensile stress is present as residual stress in the Ti layer.

In a case where thermal treatment is applied, compressive stress is applied in the thickness direction in the TiN layer, and tensile stress is applied in the thickness direction in the Ti layer, as in Example illustrated in FIG. 6. That is, as illustrated in the portion (b) of FIG. 7, the compressive stress before the thermal treatment is emphasized in the TiN layer, and the tensile stress before the thermal treatment is emphasized in the Ti layer. The compressive stress emphasized in the TiN layer acts to further emphasize the tensile stress in the Ti layer. Accordingly, the stress in the Ti layer and the stress in the TiN layer are emphasized, and a dislocation defect is more likely to occur. It is therefore impossible to suppress parasitic resistance of the pixel electrode.

In Comparative Example 1, stress applied to the TiN layer is larger than 0 but becomes smaller as a distance from the boundary between the TiN layer and the Ti layer becomes larger. Such unstable stress applied in the TiN layer becomes a cause of a crystal defect. Furthermore, in Comparative Example 1, the compressive stress generated in the TiN layer by thermal treatment can exceed residual tensile stress before the thermal treatment since the stress applied in the TiN layer is smaller than that in Example. In this case, in Comparative Example 1, the compressive stress generated in the TiN layer acts to emphasize the tensile stress in the Ti layer, as in Comparative Example 2. That is, a crystal defect cannot be effectively suppressed also in Comparative Example 1.

As described above, in the imaging device 1 according to the present embodiment, the boundary between the first layer 111 and the second layer 114 of the pixel electrode 110 is bulged upward, and thereby tensile stress generated in the thickness direction during thermal treatment can be reduced. This suppresses occurrence of a crystal defect in the first layer 111 and the second layer 114 of the pixel electrode 110, thereby suppressing parasitic resistance of the pixel electrode 110.

Manufacturing Method

Next, a method for manufacturing the imaging device 1 according to the embodiment is described. The following mainly describes a method for forming the pixel electrode 110 and a nearby structure with reference to FIGS. 8A to 8F. FIGS. 8A to 8F are schematic cross-sectional views for explaining steps of the method for forming the pixel electrode 110 and a nearby structure.

Figure 8A:
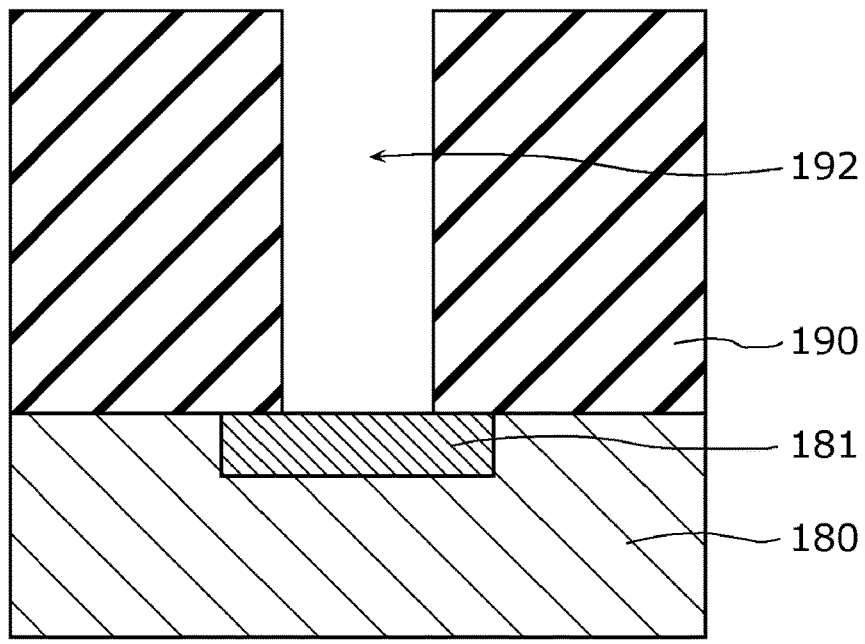
FIG. 8A is a schematic cross-sectional view for explaining a step of a method for forming a pixel electrode and a nearby structure of the imaging device according to the embodiment.

As illustrated in FIG. 8A, the pixel device unit 180 in which the signal detection transistor 22, the address transistor 24, the reset transistor 26, and the protection transistor 27 are connected by a plurality of wiring layers is formed by a known method on a surface of the semiconductor substrate 60 in a region where the imaging device 1 is to be formed. Then, the interlayer insulating layer 190 is deposited, and a contact hole 192 is formed so that at least part of the wiring layer 181, which is an uppermost layer of the pixel device unit 180, is exposed. The interlayer insulating layer 190 is formed by depositing an insulating film containing a material such as TEOS or SiN by a method such as chemical vapor deposition (CVD). The contact hole 192 is formed by removing a part of the interlayer insulating layer 190 by photolithography and etching.

Figure 8B:
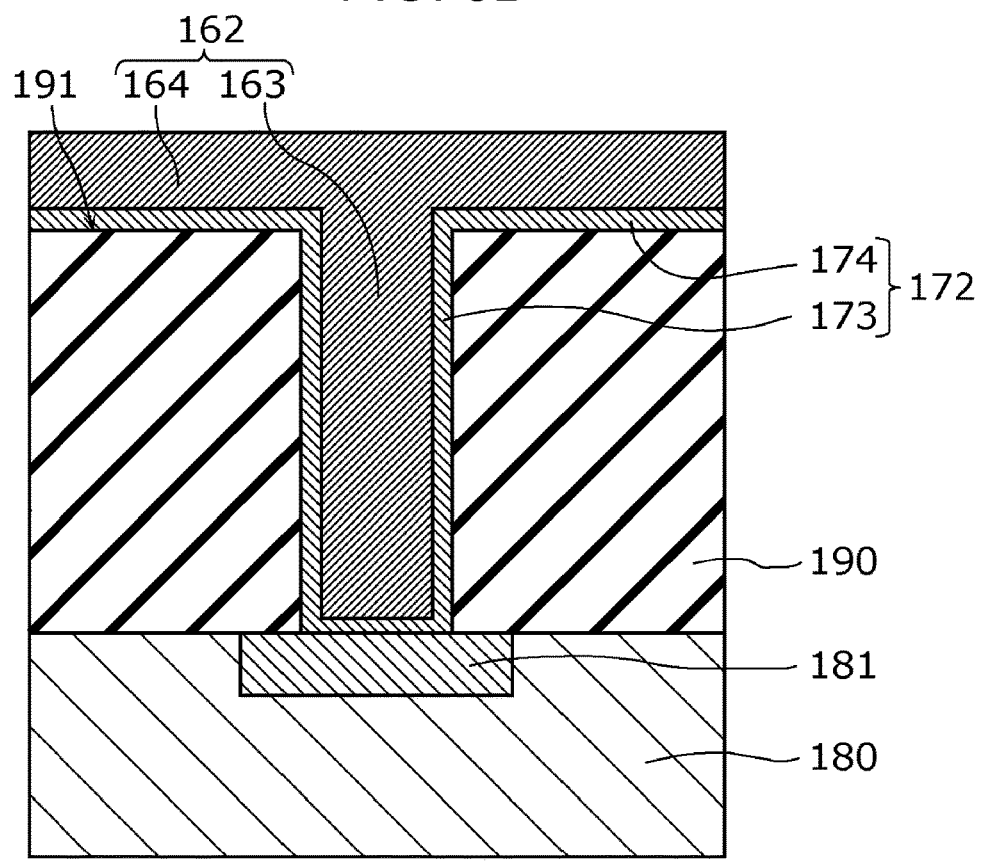
FIG. 8B is a schematic cross-sectional view for explaining a step performed next to the step illustrated in FIG. 8A.

Next, as illustrated in FIG. 8B, a barrier film 172 and a metal film 162 are sequentially formed. The barrier film 172 is a film from which the barrier layer 170 illustrated in FIG. 3 is formed and contains, for example, Ta. The barrier film 172 is formed so as to have a uniform thickness by a method such as sputtering. The barrier film 172 includes a first part 173 having a cylindrical shape with a bottom and a second part 174 having a flat plate. The first part 173 is a part along side surfaces and a bottom surface of the contact hole 192. The second part 174 is a part that covers the upper surface 191 of the interlayer insulating layer 190 in contact with the upper surface 191.

The metal film 162 is a film from which the metal layer 160 illustrated in FIG. 3 is formed and contains, for example, Cu. The metal film 162 is formed, for example, by electrolytic plating. The metal film 162 includes a first part 163 having a columnar shape and a second part 164 having a flat plate. The first part 163 is a part inside the contact hole 192 and is a part obtained by filling a region surrounded by the first part 173 of the barrier film 172. The second part 164 is a part that covers an upper part of the first part 163 and an upper surface of the second part 174 of the barrier film 172 in contact with the upper part of the first part 163 and the upper surface of the second part 174 of the barrier film 172.

Figure 8C:
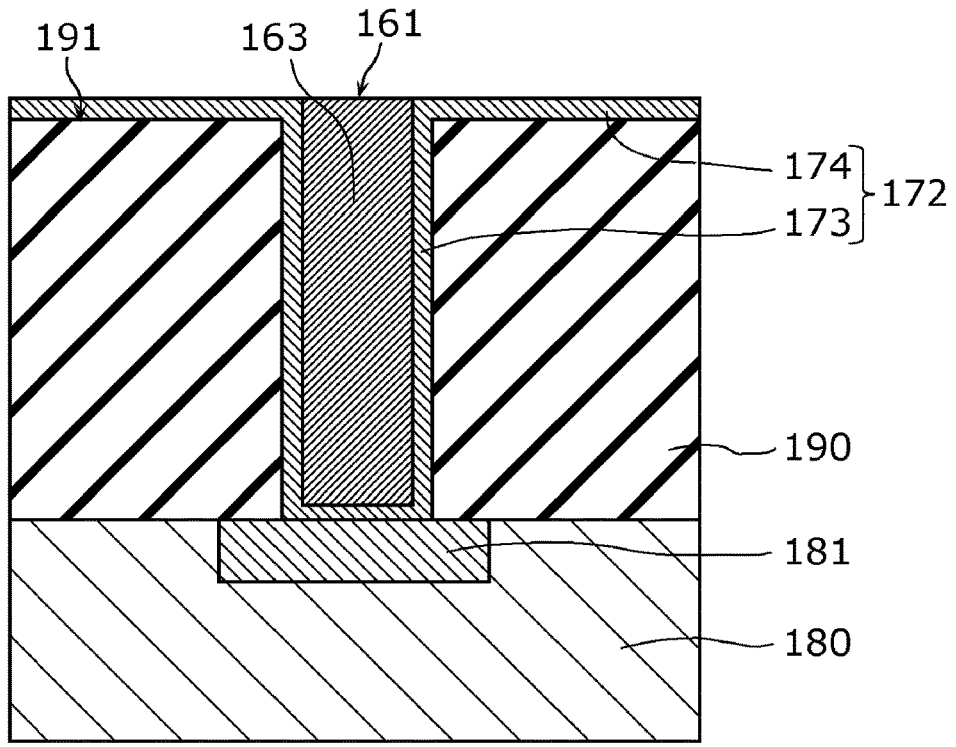
FIG. 8C is a schematic cross-sectional view for explaining a step performed next to the step illustrated in FIG. 8B.

Next, as illustrated in FIG. 8C, a surface of the metal film 162 is polished by chemical mechanical polishing (CMP). This removes the second part 164 of the metal film 162, thereby exposing the second part 174 of the barrier film 172. Only the first part 163 of the metal film 162 remains, and the upper surface 161 thereof becomes flush with the upper surface of the second part 174 of the barrier film 172.

Figure 8D:
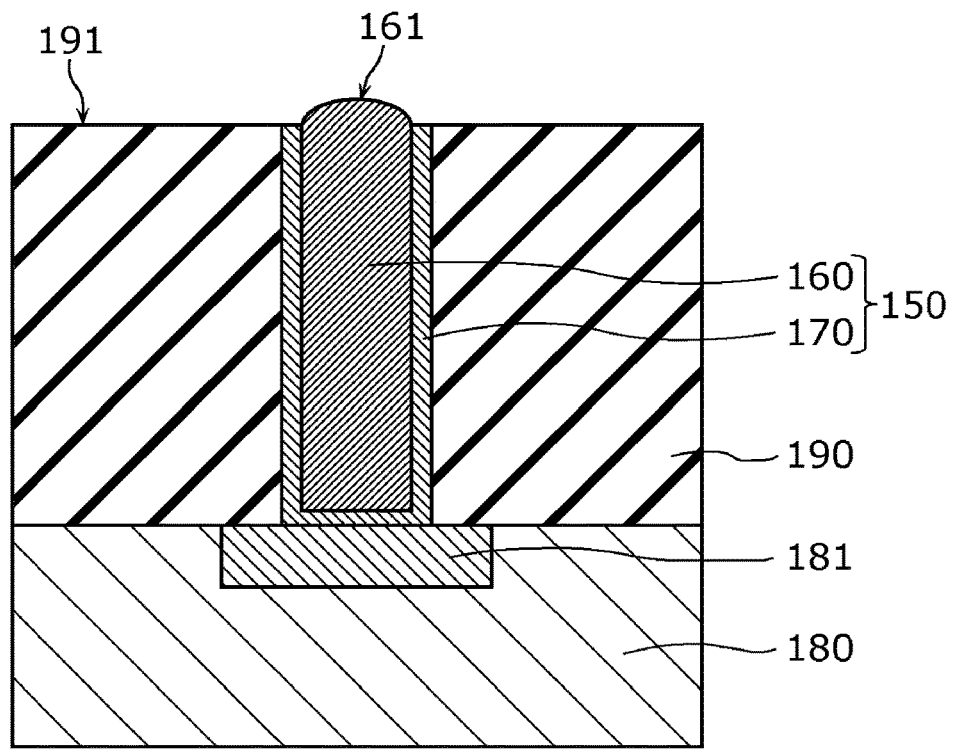
FIG. 8D is a schematic cross-sectional view for explaining a step performed next to the step illustrated in FIG. 8C.

Next, the barrier film 172 is polished at a polishing rate higher than a polishing rate of the metal film 162. Specifically, CMP is performed under a condition that Ta is more easily polished than Cu. Since the processing is performed under a condition that the first part 163 of the metal film 162 is harder to be polished, an upper part of the first part 163 remains above the upper surface 191 of the interlayer insulating layer 190 as illustrated in FIG. 8D. As a result, the finished shape in which the upper surface 161 of the first part 163 is bulged can be obtained. In this way, the contact plug 150 having the upper surface 161 protruding upward beyond the upper surface 191 of the interlayer insulating layer 190 is formed.

Figure 8E:
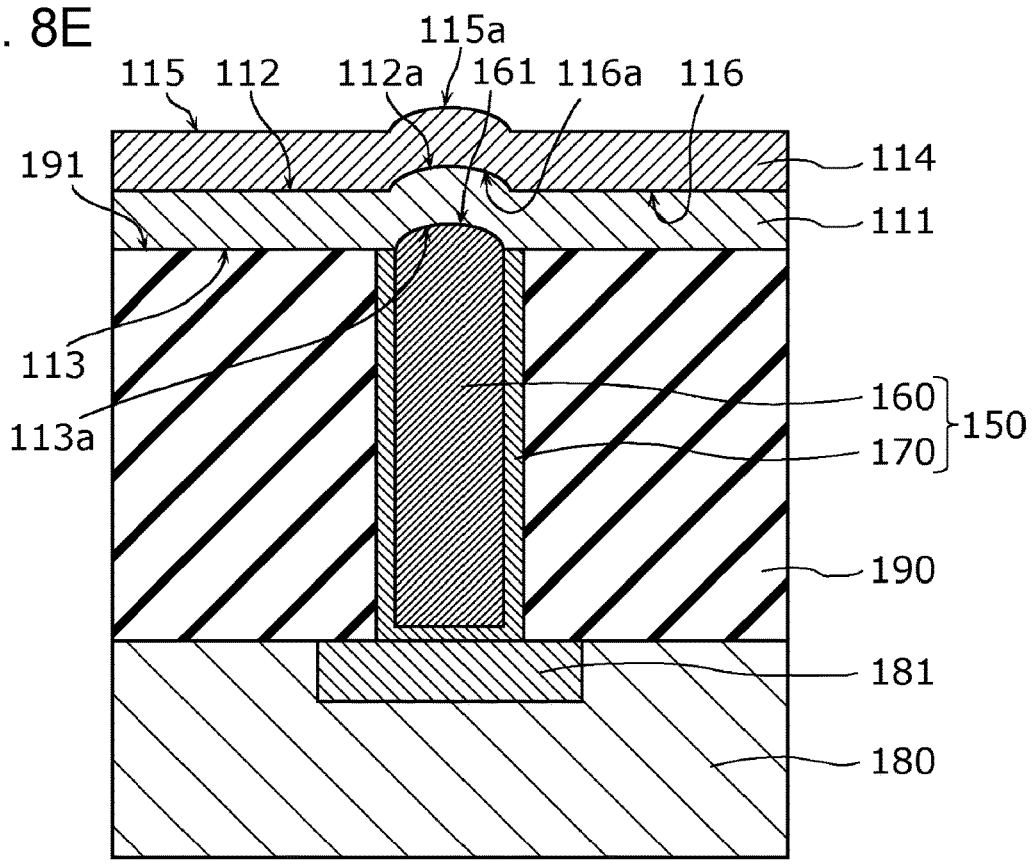
FIG. 8E is a schematic cross-sectional view for explaining a step performed next to the step illustrated in FIG. 8D.

Next, as illustrated in FIG. 8E, the first layer 111 and the second layer 114 of the pixel electrode 110 are sequentially stacked. The first layer 111 and the second layer 114 are formed, for example, by sputtering.

Since the upper surface 161 of the contact plug 150 protrudes upward beyond the upper surface 191 of the interlayer insulating layer 190, the recessed part 113a is formed on the lower surface 113 of the first layer 111, and the protrusion 112a is formed on the upper surface 112 of the first layer 111. The recessed part 116a is formed on the lower surface 116 of the second layer 114, and the protrusion 115a is formed on the upper surface 115 of the second layer 114. In this way, the protrusion 112a can be easily formed on the boundary between the first layer 111 and the second layer 114.

Figure 8F:
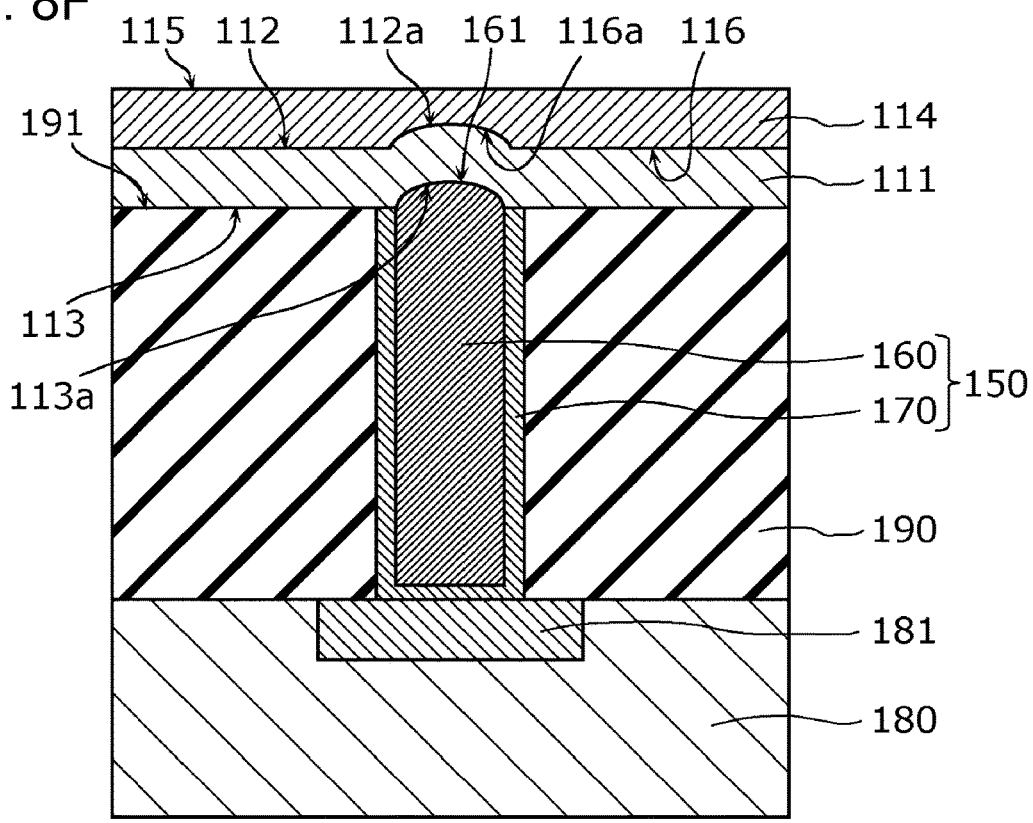
FIG. 8F is a schematic cross-sectional view for explaining a step performed next to the step illustrated in FIG. 8E.

Next, as illustrated in FIG. 8F, the upper surface 115 of the second layer 114 is flattened by polishing. That is, the protrusion 115a of the upper surface 115 of the second layer 114 is removed. By flattening the upper surface 115, the lower surface of the photoelectric conversion layer 120 formed so as to cover the pixel electrode 110 can be made flat. This can increase film quality of the photoelectric conversion layer 120, thereby increasing photoelectric conversion performance.

Other Embodiments

Although an imaging device according to one or more aspects has been described above based on the embodiment, the present disclosure is not limited to the above embodiment. Various modifications of the present embodiment which a person skilled in the art can think of and combinations of constituent elements in different embodiments are also encompassed within the scope of the present disclosure without departing from the spirit of the present disclosure.

For example, the upper surface 161 of the contact plug 150 may be flat. In this case, the recessed part 113a of the lower surface 113 of the first layer 111 may include a flat bottom surface and side surfaces that are in contact with the bottom surface. The protrusion 112a of the upper surface 112 of the first layer 111 may include a flat top surface and side surfaces that are in contact with the top surface. That is, the cross-sectional shape of the protrusion 112a may be rectangular or trapezoidal. The bottom surface of the recessed part 113a and the top surface of the protrusion 112a may be almost identical to the shape of the contact plug 150 in plan view.

For example, in the above embodiment, the upper surface 161 of the contact plug 150 may be configured not to protrude upward beyond the interlayer insulating layer 190. For example, the upper surface 161 of the contact plug 150 and the upper surface 191 of the interlayer insulating layer 190 may be flush with each other.

In this case, an intermediate layer of a predetermined shape may be provided between the first layer 111 of the pixel electrode 110 and the contact plug 150. The first layer 111 is formed in a uniform thickness so as to cover the intermediate layer. As a result, the recessed part 113a along the shape of the intermediate layer is formed on the lower surface 113 of the first layer 111. Furthermore, the protrusion 112a having a shape similar to the recessed part 113a is formed on the upper surface 112 of the first layer 111.

The intermediate layer is, for example, made of a material different from both of the pixel electrode 110 and the contact plug 150. The intermediate layer has electric conductivity but may have an insulation property. In a case where the intermediate layer has an insulation property, the intermediate layer does not cover the entire upper surface 161 of the contact plug 150, and the first layer 111 and the contact plug 150 are partially connected. This assures electric connection between the first layer 111 and the contact plug 150.

Alternatively, the thickness of the first layer 111 need not be uniform. For example, the lower surface 113 of the first layer 111 may be a flat surface, and the upper surface 112 may be a surface having the protrusion 112a as illustrated in FIG. 3. The flat lower surface 113 may cover the upper surface 161 of the contact plug 150 and the upper surface 191 of the interlayer insulating layer 190 that are flush with each other. For example, a thick electrically conductive film is formed, and a part of the electrically conductive film that does not overlap the contact plug 150 in plan view is partially removed. In this way, the first layer 111 whose portion directly above the upper surface 161 of the contact plug 150 is thicker than other portions can be formed.

In the above embodiment, various changes, replacements, additions, omissions, and the like can be made within the scope of the claims and the scope of equivalence.

The imaging device according to the present disclosure is useful, for example, for an image sensor or a digital camera. The imaging device according to the present disclosure can be, for example, used for a camera for medical use, a camera for a robot, a security camera, or an on-board camera mounted on a vehicle.

What is claimed is:

1. An imaging device comprising:
   a photoelectric conversion layer;
   a counter electrode provided above the photoelectric conversion layer;
   a pixel electrode that faces the counter electrode with the photoelectric conversion layer disposed between the counter electrode and the pixel electrode; and
   a contact plug covered with the pixel electrode and connected to the pixel electrode, wherein:
   the pixel electrode includes a first layer and a second layer provided on the first layer in contact with the first layer,
   a surface of the first layer that is in contact with the second layer has a protrusion that protrudes upward toward the counter electrode and is disposed just above the contact plug, and
   an upper surface of the second layer is flat.

2. The imaging device according to claim 1, wherein the protrusion has a convex curve.

3. The imaging device according to claim 1, wherein a lower surface of the first layer has a recessed part recessed upward toward the counter electrode.

4. The imaging device according to claim 3, wherein an upper surface of the contact plug is in contact with the recessed part.

5. The imaging device according to claim 3, further comprising an insulating layer that covers a side surface of the contact plug,
   wherein an upper surface of the contact plug protrudes upward beyond the insulating layer.

6. The imaging device according to claim 1, wherein the first layer is a Ti layer; and
   the second layer is a TiN layer.

7. The imaging device according to claim 1, wherein the contact plug includes a Cu layer and a barrier layer that surrounds a side surface of the Cu layer; and
   the barrier layer contains Ta.

8. The imaging device according to claim 1, wherein the contact plug has a protrusion that protrudes upward toward the counter electrode.

9. An imaging device comprising:
   a photoelectric conversion layer;
   a counter electrode;
   a pixel electrode that faces the counter electrode via the photoelectric conversion layer; and
   a contact plug connected to the pixel electrode, wherein:
   the pixel electrode includes a first layer and a second layer,
   the second layer is in contact with a first surface of the first layer and is closer to the photoelectric conversion layer than the first layer is,
   the first surface of the first layer has a protrusion that protrudes toward the photoelectric conversion layer and is disposed just above the contact plug, and
   the second layer has a surface that faces the photoelectric conversion layer and that is flat.

10. The imaging device according to claim 9, wherein the protrusion has a convex curve.

11. The imaging device according to claim 9, wherein the first layer has a second surface that is opposite to the first surface and that has a recessed part recessed toward the photoelectric conversion layer.

12. The imaging device according to claim 11, wherein the contact plug has a surface that is in contact with the recessed part.

13. The imaging device according to claim 11, further comprising an insulating layer that covers a side surface of the contact plug.

14. The imaging device according to claim 9, wherein:
    the first layer contains Ti, and
    the second layer contains TiN.

15. The imaging device according to claim 9, wherein:
    the contact plug includes a plug and a third layer that surrounds a side surface of the plug,
    the plug contains Cu, and
    the third layer contains Ta.

16. The imaging device according to claim 9, wherein the contact plug has a surface that faces the photoelectric conversion layer and that has a convex shape protruding toward the photoelectric conversion layer.

17. An imaging device comprising:
a photoelectric conversion layer;
a counter electrode provided above the photoelectric conversion layer;
a pixel electrode that faces the counter electrode with the photoelectric conversion layer disposed between the counter electrode and the pixel electrode; and
a contact plug covered with the pixel electrode and connected to the pixel electrode, wherein:
the pixel electrode includes a first layer and a second layer provided on the first layer in contact with the first layer,
a surface of the first layer that is in contact with the second layer has a protrusion that protrudes upward toward the counter electrode and is disposed just above the contact plug,
the second layer has a first part overlapping with the contact plug and a second part not overlapping with the contact plug in plan view, and
a thickness of the first part is smaller than a thickness of the second part.

* * * * *